(12) United States Patent
Jeon et al.

(10) Patent No.: US 7,248,768 B2
(45) Date of Patent: Jul. 24, 2007

(54) OPTICAL INTERCONNECTION MODULE AND METHOD OF MANUFACTURING THE SAME

(75) Inventors: Keum Soo Jeon, Gyeonggi-Do (KR); Min Su Lee, Gyeonggi-Do (KR); Sung Ho Kang, Gyeonggi-Do (KR); Yong Wook Kim, Gyeonggi-Do (KR); In Su Park, Gyeonggi-Do (KR)

(73) Assignee: Doosan Corporation, Seoul (KR)

( * ) Notice: Subject to any disclaimer, the term of this patent is extended or adjusted under 35 U.S.C. 154(b) by 9 days.

(21) Appl. No.: 11/285,624

(22) Filed: Nov. 22, 2005

(65) Prior Publication Data

US 2007/0077008 A1    Apr. 5, 2007

(30) Foreign Application Priority Data

Sep. 30, 2005    (KR) ...................... 10-2005-0092541

(51) Int. Cl.
    G02B 6/26    (2006.01)
    G02B 6/42    (2006.01)
    G02B 6/36    (2006.01)

(52) U.S. Cl. ............................. 385/47; 385/39; 385/88
(58) Field of Classification Search ................... 385/47
    See application file for complete search history.

(56) References Cited

U.S. PATENT DOCUMENTS

| 3,896,305 | A | * | 7/1975 | Ostrowsky et al. | ..... 250/227.24 |
| 5,832,150 | A | * | 11/1998 | Flint | ............................ 385/31 |
| 5,987,202 | A | * | 11/1999 | Gruenwald et al. | ........... 385/49 |
| 6,115,521 | A | * | 9/2000 | Tran et al. | ..................... 385/52 |
| 6,118,908 | A | * | 9/2000 | Bischel et al. | ................. 385/14 |
| 6,516,115 | B1 | * | 2/2003 | Fujita et al. | ................... 385/31 |
| 6,722,792 | B2 | * | 4/2004 | Raj et al. | ....................... 385/88 |
| 6,791,447 | B2 | * | 9/2004 | Scheible et al. | ............ 336/221 |
| 6,793,405 | B1 | | 9/2004 | Murata et al. | |
| 6,832,031 | B2 | * | 12/2004 | Smaglinski | .................. 385/47 |
| 6,898,347 | B2 | * | 5/2005 | Junnarkar et al. | ............ 385/31 |
| 7,076,125 | B2 | * | 7/2006 | Kouta et al. | .................. 385/14 |

(Continued)

FOREIGN PATENT DOCUMENTS

| EP | 1020747 | 7/2000 |
| KR | 2003-94712 | 12/2003 |
| WO | 0008505 | 2/2000 |

*Primary Examiner*—Frank Font
*Assistant Examiner*—Ryan Lepisto
(74) *Attorney, Agent, or Firm*—Harness, Dickey & Pierce, PLC

(57) ABSTRACT

The present invention relates generally to an optical interconnection module for vertical optical coupling and a method of manufacturing the optical interconnection module. The optical interconnection module includes an optical waveguide. The optical waveguide includes substrate on which electrode pads and a predetermined circuit pattern are formed; a light source unit provided on the substrate and configured to generate an optical signal and emit the signal to an outside; an optical detection unit for receiving the optical signal from the light source unit and converting the optical signal into an electric signal; drive units provided on the substrate and configured to drive the light source unit and the light detection unit in response to electric signals supplied through the electrode pads; and a cladding layer, a core layer layered on the cladding layer, and an elliptical reflecting mirror surface placed on an end of the core layer facing the light source unit.

13 Claims, 13 Drawing Sheets

U.S. PATENT DOCUMENTS

| | | | |
|---|---|---|---|
| 2002/0085785 A1* | 7/2002 | Kishimoto et al. | 385/14 |
| 2003/0095746 A1* | 5/2003 | Williamson | 385/33 |
| 2003/0165291 A1* | 9/2003 | Bhagavatula et al. | 385/33 |
| 2003/0202748 A1* | 10/2003 | Gordon et al. | 385/48 |
| 2003/0223705 A1* | 12/2003 | Hill et al. | 385/92 |
| 2004/0013358 A1* | 1/2004 | Zhang | 385/31 |

* cited by examiner

PRIOR ART

OPTICAL INTERCONNECTION MODULE AND METHOD OF MANUFACTURING THE SAME

BACKGROUND OF THE INVENTION

1. Field of the Invention

The present invention relates generally to an optical interconnection module for vertical optical coupling and a method of manufacturing the optical interconnection module.

2. Description of the Related Art

In the majority of electronic systems, the electrical connections between circuit boards, chips or systems are implemented using a metallic wire. However, as the amount of information is getting larger and transmission speed dramatically increases, electrical problems, such as skew in clock signals and electromagnetic interference (EMI), restrict speed of today's electronic systems to the limit of a few GHz. Furthermore, thermal dissipation is another big problem in high speed electronic systems. To overcome such problems, optical interconnection is introduced into circuit board level. Optical interconnection has great advantage over electronic wiring, not causing any EMI and thermal problems. However, vertical coupling of light on circuit board is a big challenge in routing optical signals, on the basis that most of opto-electronic components are packaged as a form of surface-mounted device.

Recently, optical coupling technologies using an optical transceiver (transmitter/receiver) module has been developed. Optical coupling methods in optical transceiver modules include: (1) a method of directly coupling an photo-detecting device to a ribbon optical fiber or a multi-channel optical connector having a reflecting mirror inclined at an angle of 45°, (2) a method of coupling optical transceiver devices to a polymer optical waveguide having a reflecting mirror, which is cut at an angle of 45°, and (3) a method of perpendicularly integrating optical transceiver devices, which are packaged in a single module, with a multi-channel optical connector.

In the above cases, a Vertical Cavity Surface Emitting Laser (VCSEL) array is commonly used as an optical transmission device, that is, a light source, while a photodiode array is used as a phto-detection device, that is, a detector.

Various optical interconnection modules for vertical coupling of light into an optical waveguide have been developed.

For example, an optical module disclosed in Korean Patent Application No. 2000-7003642 is designed in such a way that light emitted from a VCSEL is reflected through 90° at the end portion of optical waveguide and is transmitted to an optical fiber, which is connected to an optical connector, along a core formed in a substrate.

Meanwhile, Korean Unexamined Patent Publication 2003-94712 discloses a parallel optical interconnection transceiver module including an optical waveguide with a lens-type reflecting surface. This structure has advantage in reducing coupling loss caused by misalignment between optical components at coupling stage.

FIG. 1 shows the structure of the optical waveguide 40 having the curved reflecting surface that is disclosed in Korean Unexamined Patent Publication No. 2003-94712.

Referring to FIG. 1, a curved reflecting surface 44 has a predetermined curvature, which is formed at an end of the core 42 of the optical waveguide 40.

The core 42 is made of polymer or epoxy-based material transparent to specified wavelength range. The reflectance of light incident at the reflecting surface 44 strongly depends on the shape of it. To increase reflectance, reflecting surface 44 is circularly rounded with predetermined curvature.

However, a conventional 45° reflection mirror surface or the curved reflecting mirror surface disclosed in FIG. 1 has a problem in that light incoming from a light source unit 30 is not totally reflected and some rays of the light leak out of the optical waveguide, thus causing loss.

Furthermore, the two mirror surfaces, 45° reflection mirror and circularly curved mirror, can not focus incoming rays 3-dimensionally into the core, leading to light leakages in a lateral direction (the direction from the right side to the left side of the optical waveguide), because even the circularly curved mirror (a piece of cylindrical surface) has a two-dimensionally varying shape.

SUMMARY OF THE INVENTION

Accordingly, the present invention has been made keeping in mind the above problems occurring in the previous art, and the objective of present invention is to provide an optical interconnection module having an optical waveguide. The optical waveguide embodies a reflecting mirror surface which is formed at an end of the optical waveguide, utilizing the total internal reflection of an ellipse; hence not only are the incoming waves totally reflected but also focused, at the same time, to the core of optical waveguide. If the light source is located at one focal point of the ellipse and the core of waveguide is centered at the other focal point of the ellipse, with the body of waveguide aligned with the direction of the light reflected from the mirror surface, the coupling loss from the light source to the optical waveguide can be completely prevented.

Another object of the present invention is to provide a method of manufacturing an optical interconnection module by aligning an optical waveguide having an elliptically curved surface.

In order to accomplish the above objective, the present invention provides an optical interconnection module, comprising a substrate on which electrode pads and a circuit pattern are formed; a light source provided on the substrate and configured to generate an optical signal and emit the signal to an outside; an optical detection unit for receiving the optical signal from the light source unit and converting the optical signal into an electric signal; driver unit provided on the substrate and configured to drive the light source unit and the light detection unit in response to electric signals supplied through the electrode pads; and an optical waveguide including a cladding layer, a core layer covered with the cladding layer, and an elliptical reflecting mirror surface formed at an end of the core layer, which reflects and focuses light incident from the light source unit.

In the optical interconnection module according to the present invention, the incident angle of the light coming from a light source is determined by the following Equation:

$$\theta = \frac{1}{2}\sin^{-1}\left(\frac{2}{PF \cdot PF'}\sqrt{S(S-PF)(S-PF')(S-FF')}\right)$$

where $$S = \frac{1}{2}(PF + PF' + FF'),$$

PF is a distance from a point of an ellipse to a focal point F,

PF' is a distance from the point of the ellipse to a focal point F', and

FF' is a distance between the focal points.

In the optical interconnection module according to the present invention, the light source unit includes a VCSEL array.

In the optical interconnection module according to the present invention, the light source is located at one focal point of an ellipse forming the reflecting mirror surface, and the core of optical waveguide is centered at the other focal point in such a manner that the body of waveguide is oriented to the direction of light reflected through 90 degrees from the mirror surface.

In the optical interconnection module according to the present invention, the length l of the total reflection region of the elliptical reflecting mirror is determined by the following Equation:

$$l = 2ab \int_{\phi_c}^{\frac{\pi}{2}} \frac{1}{\sqrt{a^2 + \sin^2\phi + b^2\cos^2\phi}} d\phi$$

where $\phi_c$ is an angle between line $\overline{OP_c}$, which extends from an origin O of the ellipse to point $P_c(x_c, y_c)$ from which a critical angle starts, and an x axis, a is a length of a major axis of the ellipse, and b is a length of a minor axis of the ellipse, wherein $\phi_c$ is determined by the following Equation:

$$\phi_c = \sin^{-1}\left(\frac{2}{OF \cdot r_c}\sqrt{T(T-OF)(T-r)(T-P_c)}\right)$$

where $$T = \frac{1}{2}(OF + r_c + P_cF),$$

$OF = \sqrt{a^2 - b^2}$, a distance between the origin and the focal point, $r_c = \sqrt{x_c^2 + y_c^2}$, a distance between the origin and point $P_c(x_c, y_c)$, $P_cF = \sqrt{(x_c - \sqrt{a^2-b^2})^2 + y_c^2}$, a distance between the focal point and point $P_c(x_c, y_c)$.

In the optical interconnection module according to the present invention, a ratio of the major axis to the minor axis a/b is approximately 2.

In the optical interconnection module according to the present invention, the elliptical reflecting mirror surface is a 3-dimensional curved surface.

The optical interconnection module according to the present invention further includes partition blocks that support shaping the elliptical reflecting mirror surface at the end of the optical waveguide.

The optical interconnection module according to the present invention further includes an elliptically curved reflecting mirror surface that is formed at an end of the core layer of the optical waveguide facing the optical detection unit.

The optical interconnection module according to the present invention further includes a housing for protecting the light source unit, the optical detection unit, the drive units and connection wiring thereof.

In the optical interconnection module according to the present invention, the optical detection unit comprises a photodiode array.

Meanwhile, the present invention provides a method of manufacturing an optical interconnection module, including the steps of fabricating an optical waveguide in such a manner that a cladding layer is deposited on a substrate of the optical waveguide, a core layer is then deposited on the cladding layer, partition blocks are formed at the end of the two sides of the core layer, and an elliptical reflecting mirror surface is shaped in a space between the partition blocks; forming electrode pads on the substrate of the optical waveguide to connect a light source unit and an optical detection unit to the optical waveguide, and providing solder bumps beside first ends of the electrode pads; mounting the light source unit and the optical detection unit on the substrate of the optical waveguide, with the light source unit and the optical detection unit connected to the solder bumps; attaching the substrate of the optical waveguide, on which the light source unit and the optical detection unit are mounted, to a previously manufactured printed circuit board at a predetermined location; and mounting drive units on ground electrodes formed on the printed circuit board, connecting the drive units to the light source unit and the optical detection unit, and connecting the drive units to electric pads formed on the printed circuit board to achieve external electrical connections.

The method according to the present invention further includes the step of mounting a housing to protect the optical waveguide, the light source unit and the optical detection unit connected to the optical waveguide, and connection wiring thereof.

In the method according to the present invention, keys or marks for aligning the light source unit and the optical detection unit are formed on the substrate of the optical waveguide in which the elliptical reflecting mirror surface is formed between the partition blocks.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
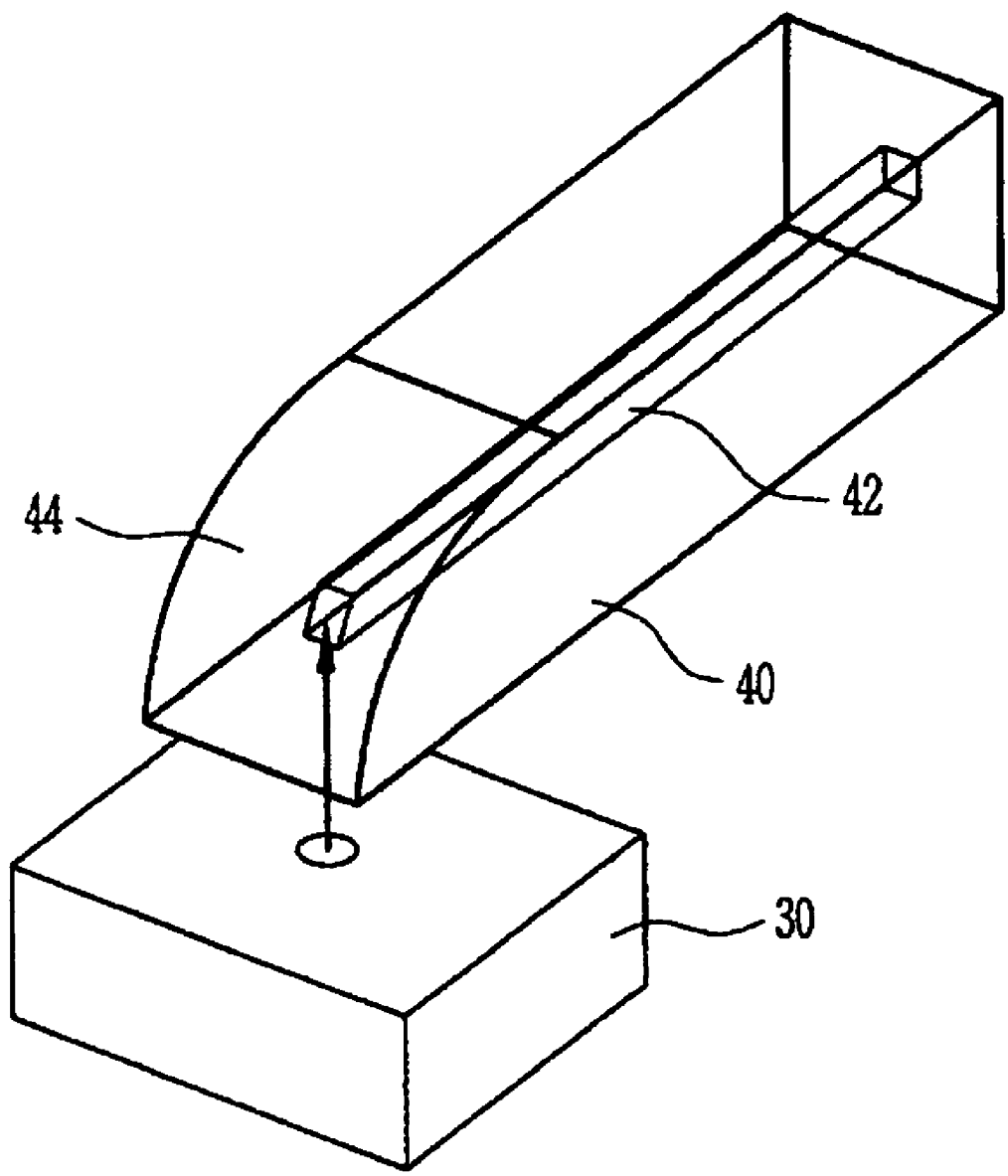
FIG. 1 is a side view of the optical waveguide of a conventional parallel optical interconnection module.

Reference now should be made to the drawings, in which the same reference numerals are used throughout the different drawings to designate the same or similar components.

The present invention is described in more detail with reference to the accompanying drawings in conjunction with embodiments illustrated in the drawings.

Figure 2A:
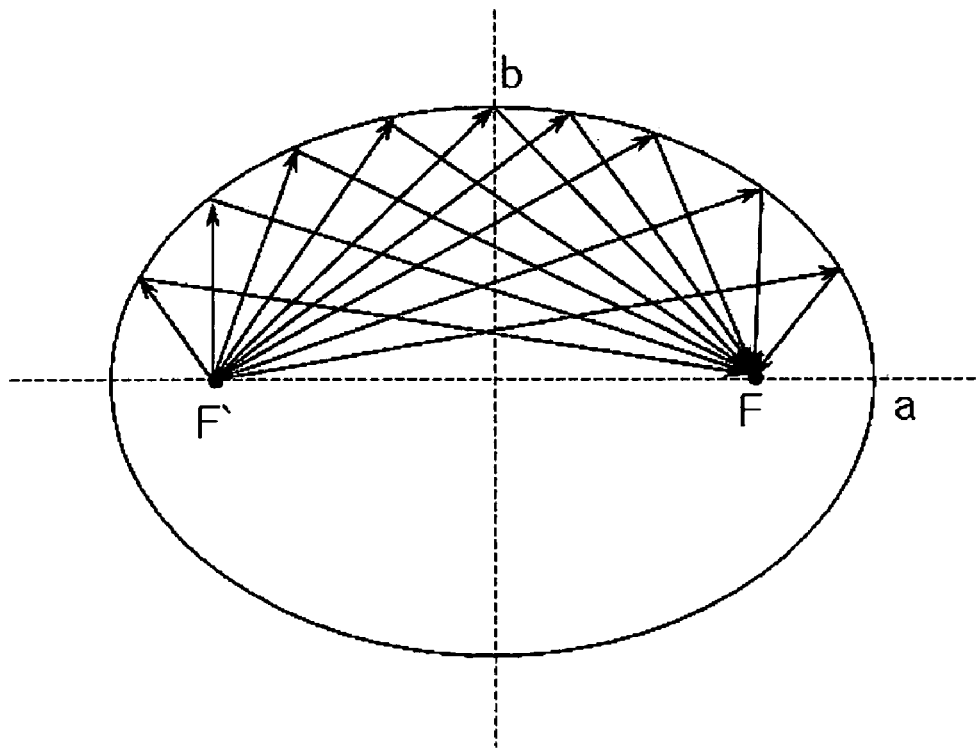
FIG. 2A is a diagram illustrating the reflection characteristics of an ellipse that is employed in the structure of a reflecting mirror surface that is applied to an end of the optical waveguide of the present invention.
Figure 2B:
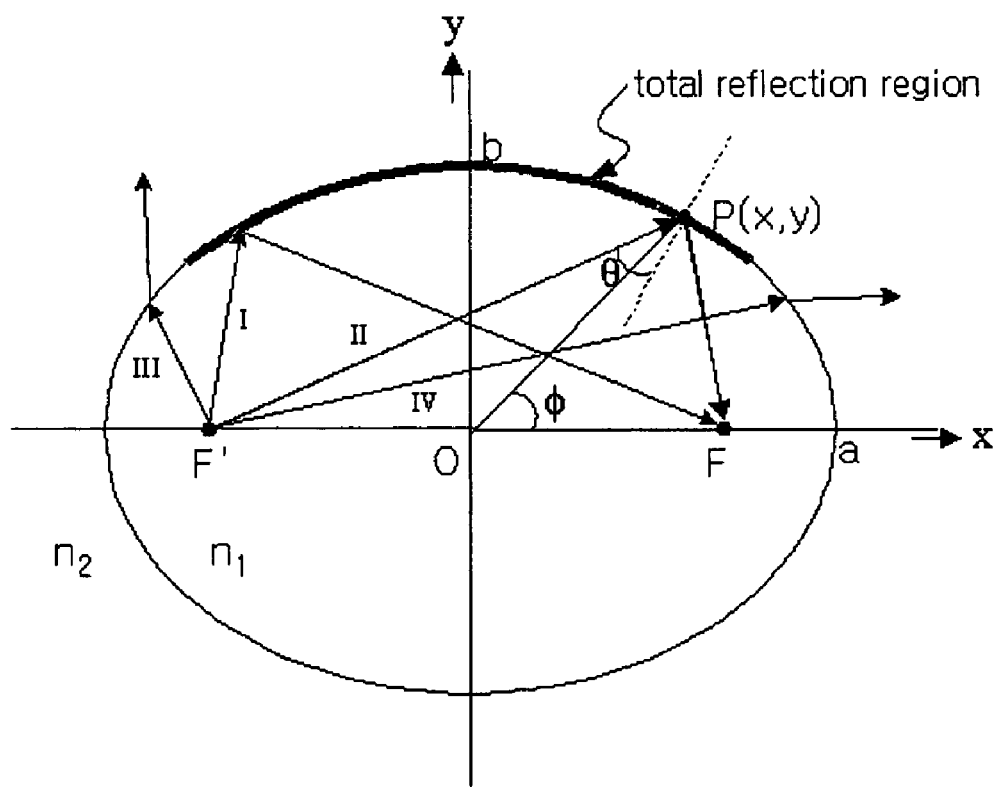
FIG. 2B is a diagram illustrating a region that satisfies a total reflection condition.

FIG. 2A is a diagram illustrating the reflection characteristics of an ellipse that is employed in the structure of a reflecting mirror surface that is applied to an end of the optical waveguide of the present invention. FIG. 2B is a diagram illustrating a region that satisfies a total reflection condition.

In FIG. 2A, if the boundary of an ellipse is a mirror surface, all of the rays of light emitted from one focal point F' are reflected by the boundary of the ellipse and gather at the other focal point F.

Even if the boundary of the ellipse is not a mirror surface but is a surface made of a material having a reflective index $n_1$, a region that satisfies the total reflection condition exists, as shown in FIG. 2B, when a refractive index $n_1$ on the interior of the ellipse is larger than a refractive index $n_2$ on the exterior of the ellipse.

The region that satisfies the total reflection condition in the ellipse of FIG. 2B having a major axis 'a' and a minor axis 'b' can be calculated.

In triangle PFF', incident angle θ or ½ ∠FPF' at point P(x, y) on an ellipse is expressed using trigonometry by the following equation:

$$\sin 2\theta = \frac{2}{PF \cdot PF'} \sqrt{S(S - PF)(S - PF')} \quad (1)$$

that is, $$\theta = \frac{1}{2}\sin^{-1}\left(\frac{2}{PF \cdot PF'} \sqrt{S(S - PF)(S - PF')(S - FF')}\right) \quad (2)$$

where $$S = \frac{1}{2}(PF + PF' + FF') \quad (3)$$

$$PF = \sqrt{\left(x - \sqrt{a^2 - b^2}\right)^2 + y^2} \quad (4)$$

-continued $$PF' = \sqrt{\left(x + \sqrt{a^2 - b^2}\right)^2 + y^2} \quad (5)$$

$$FF' = 2\sqrt{a^2 - b^2} \quad (6)$$

Critical angle $\theta_c$ that satisfies the total reflection condition is expressed by the following equation:

$$\sin\theta_c = \frac{n_2}{n_1} \text{ (where } n_1 > n_2\text{)} \quad (7)$$

that is, $$\theta_c = \sin^{-1}\frac{n_2}{n_1} \quad (8)$$

As a result, total reflection always occurs at the point P of an ellipse that satisfies the condition that the incident angle θ be larger than critical angle $\theta_c$, that is, $\theta \geq \theta_c$.

The region that satisfies the total reflection condition in an ellipse symmetrically exists on both sides of the minor axis of the ellipse, as illustrated by the bold line in FIG. 2B. Of the rays of light starting from one focal point F', the rays of light incident on the total reflection region (rays I and II of FIG. 2B) are totally reflected and gather at the other focal point F.

In contrast, the rays of light (rays III and IV of FIG. 2B) incident on the boundary portion of the ellipse other than the total reflection region deviate from the ellipse.

The total reflection region of the ellipse is calculated using Equations 1 to 8 and condition $\theta \geq \theta_c$.

For example, when the length of the major axis of an ellipse is 'a' and the length of the minor axis is 'b', incident angles based on the ratio of the major axis to the minor axis a/b are calculated for a range of the x axis. When the refractive index $n_1$ on the interior of the ellipse is 1.5 and the refractive index $n_2$ on the exterior of the ellipse is 1, a critical angle is 41.81°.

In this case, if the ratio of the major axis to the minor axis a/b is excessively small, an incident angle at every point of an eclipse is smaller than a critical angle $\theta_c$=41.81°, so that a region satisfying the total reflection condition does not exist. In contrast, if the ratio a/b is large, the range on the x axis that satisfies the total reflection condition increases.

However, even though the range on the x axis satisfying the total reflection condition increases as the ratio a/b increases, the length of the entire total reflection region of the ellipse does not always increase.

Figure 3:
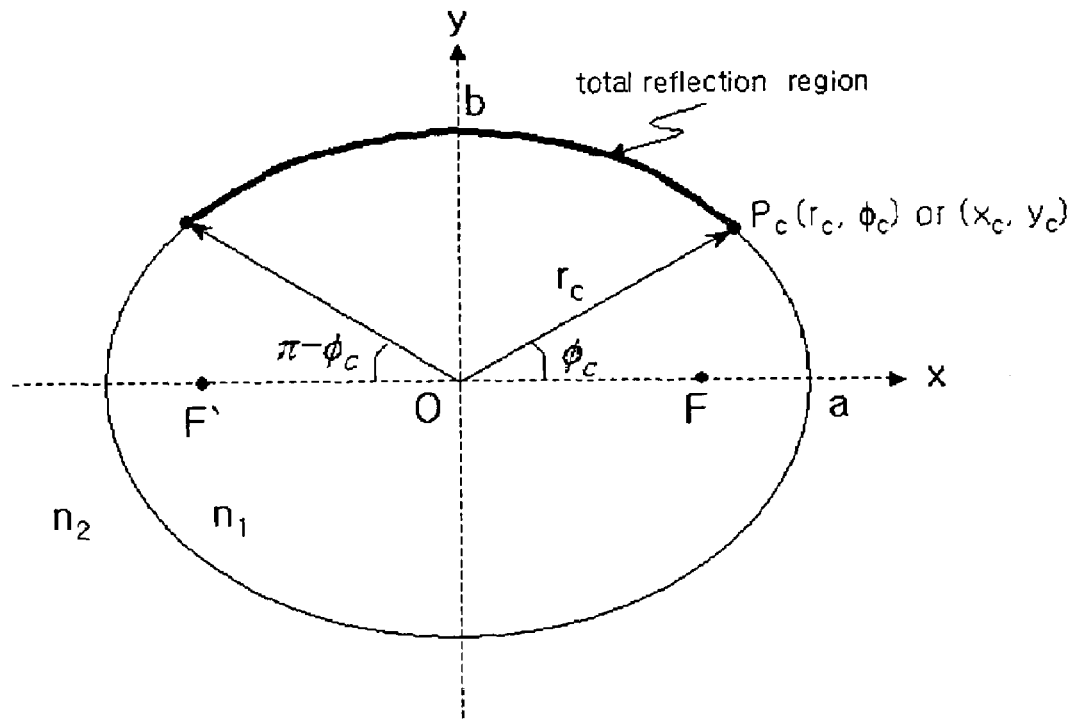
FIG. 3 is a diagram illustrating the polar coordinate system of an ellipse that constitutes a reflecting mirror surface that is applied to the end of the optical waveguide according to the present invention.

Meanwhile, the length of the entire total reflection region of the ellipse can be obtained using a polar coordinate system, as in FIG. 3, as follows:

$$l = \int_{\phi_c}^{\pi - \phi_c} r d\phi = \int_{\phi_c}^{\pi - \phi_c} \sqrt{\frac{a^2 b^2}{a^2 \sin^2\phi + b^2 \cos^2\phi}} \, d\phi \quad (9)$$

here $\phi_c$ is the angle between line $\overline{OP_c}$ extending from origin O to point $P_c$ and the x axis, and r is the distance between the origin O and the point of the ellipse. Since the total reflection region is vertically symmetrical, Equation 9 can be rewritten as follows:

$$l = 2ab \int_{\phi_c}^{\frac{\pi}{2}} \frac{1}{\sqrt{a^2 \sin^2 \phi + b^2 \cos^2 \phi}} d\phi \quad (10)$$

In Equation 10, $\phi_c$ cannot be simply obtained in an analytical manner, but is calculated through the following procedure. First, point $P_c(x_c, y_c)$ which satisfies the following Equation 11 and from which total reflection starts is obtained using a numerical analysis.

$$\frac{1}{2} \sin^{-1} \left( \frac{2}{PF \cdot PF'} \sqrt{S(S-PF')(S-PF')(S-FF')} \right) - \sin^{-1} \frac{n_2}{n_1} = 0 \quad (11)$$

$\phi_c$ can be obtained using the coordinates of point $P_c(x_c, y_c)$ calculated from Equation 11 and Equation 12.

$$\phi_c = \sin^{-1} \left( \frac{2}{OF \cdot r_c} \sqrt{T(T-OF)(T-r)(T-P_c)} \right) \quad (12)$$

where $$T = \frac{1}{2}(OF + r_c + P_c F) \quad (13)$$

$$OF = \sqrt{a^2 - b^2} \quad (14)$$

$$r_c = \sqrt{x_c^2 + y_c^2} \quad (15)$$

$$P_c F = \sqrt{\left(x_c - \sqrt{a^2 - b^2}\right)^2 + y_c^2} \quad (16)$$

Figure 4:
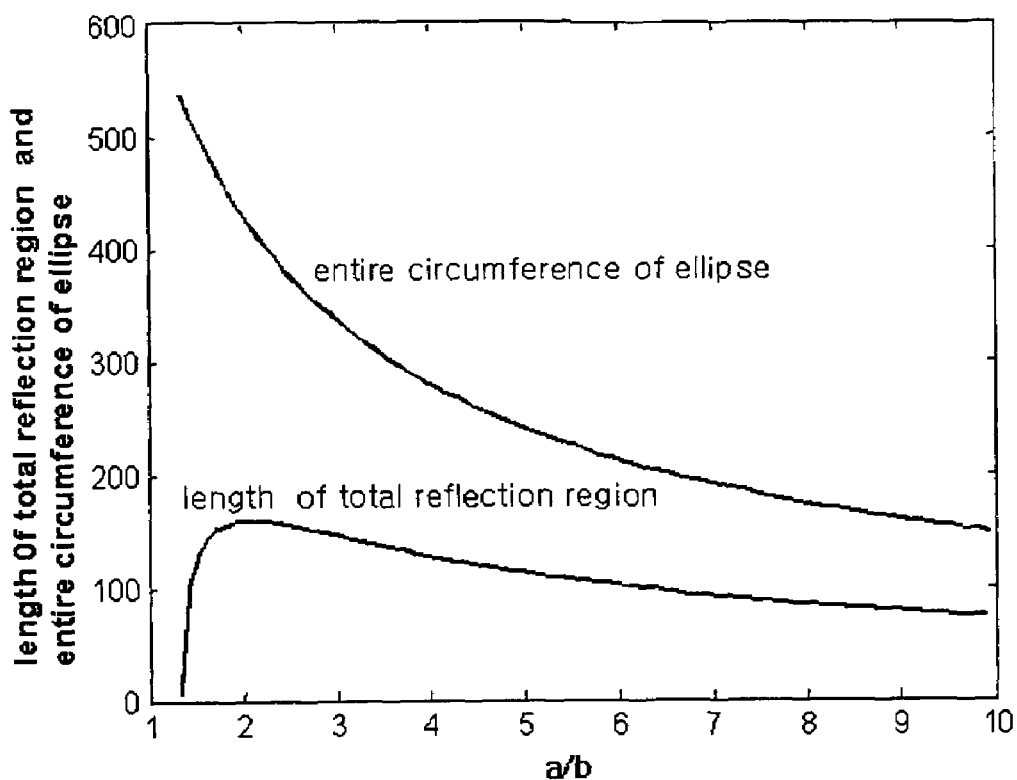
FIG. 4 is a graph illustrating the lengths of total reflection regions according to the ratio of the major axis of the ellipse, which constitutes the reflecting mirror surface that is applied to the end of the optical waveguide according to the present invention, to the minor axis thereof.

FIG. 4 illustrates the results of the calculation of the entire circumferences of ellipses and the lengths of total reflection regions based on the ratios of the major axes of the ellipses to the minor axes thereof using Equations 10 and 11. Since the minor axis b decreases as the ratio of the major axis to the minor axis a/b increases, the entire circumference of the ellipse continuously decreases. However, the length of the total reflection region increases to a specific point and then decreases again. In a region where the ratio of the major axis to the minor axis a/b is small, the entire circumference of the ellipse decreases in proportion to the ratio a/b, and an increase in the length of the x axis that satisfies the total reflection condition is large, so that the length of the total reflection region increases. However, in a region where the ratio a/b is large, a decrease in the entire circumference of the ellipse is larger than an increase in the length of the x axis that satisfies the total reflection condition, so that the length of the total reflection area decreases in proportion to the ratio a/b.

Accordingly, as illustrated in FIG. 4, it can be appreciated that a total reflection region having the largest range can be obtained when the ratio of the major axis to the minor axis a/b is about 2.

Now, the optical waveguide having an elliptical mirror surface for vertical optical coupling can be designed using the above-described condition.

Figure 5:
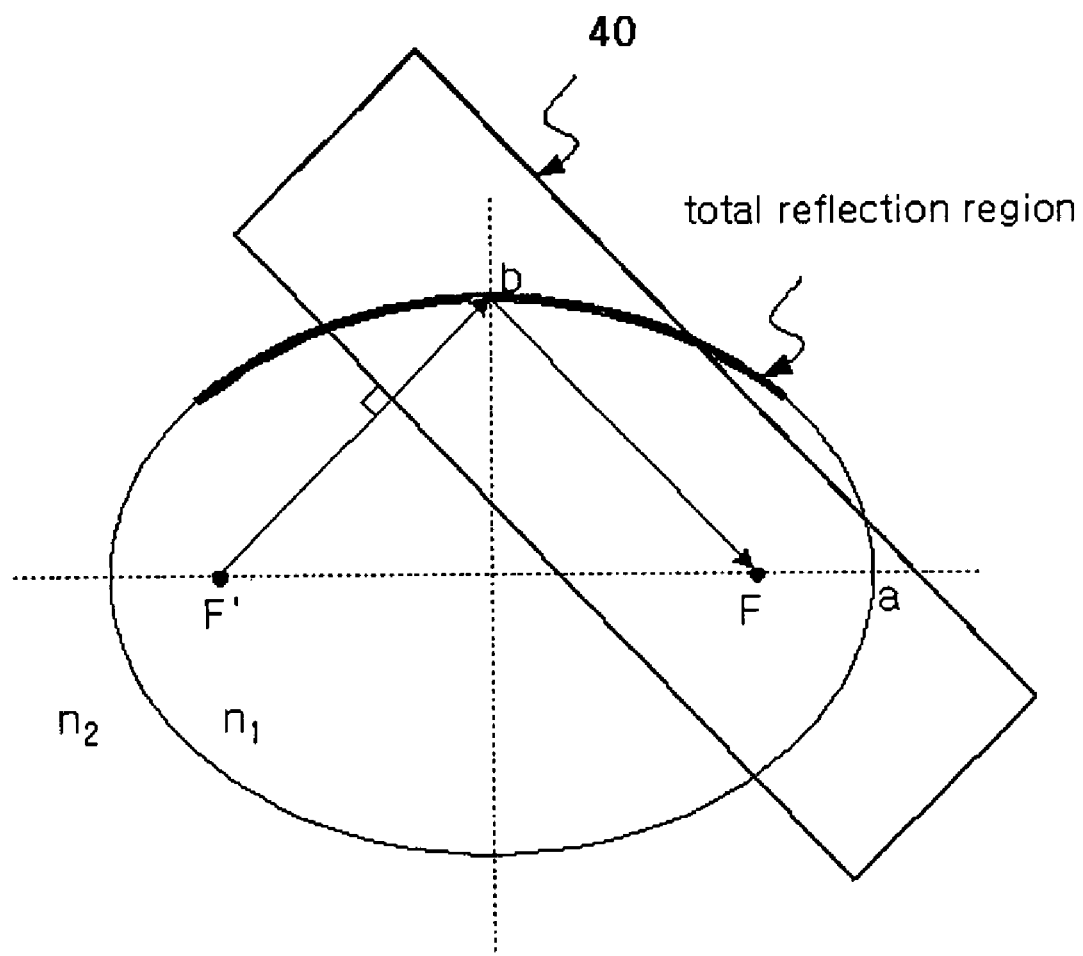
FIG. 5 is a design drawing in which an elliptical shape is aligned with the reflecting mirror surface that is applied to the end of the optical waveguide according to the present invention.

The optical waveguide is designed in such a way that, after the ratio of the major axis to the minor axis a/b has been determined to ensure a sufficient total reflection region, the optical waveguide is disposed to coincide with the central portion of the total reflection region and a light source is located at a focal point F, as shown in FIG. 5.

In that case, as illustrated in FIG. 5, the optical waveguide 40 is aligned with the light moving from the center of the total reflection region (located on the y axis) to the focal point F.

Figure 6:
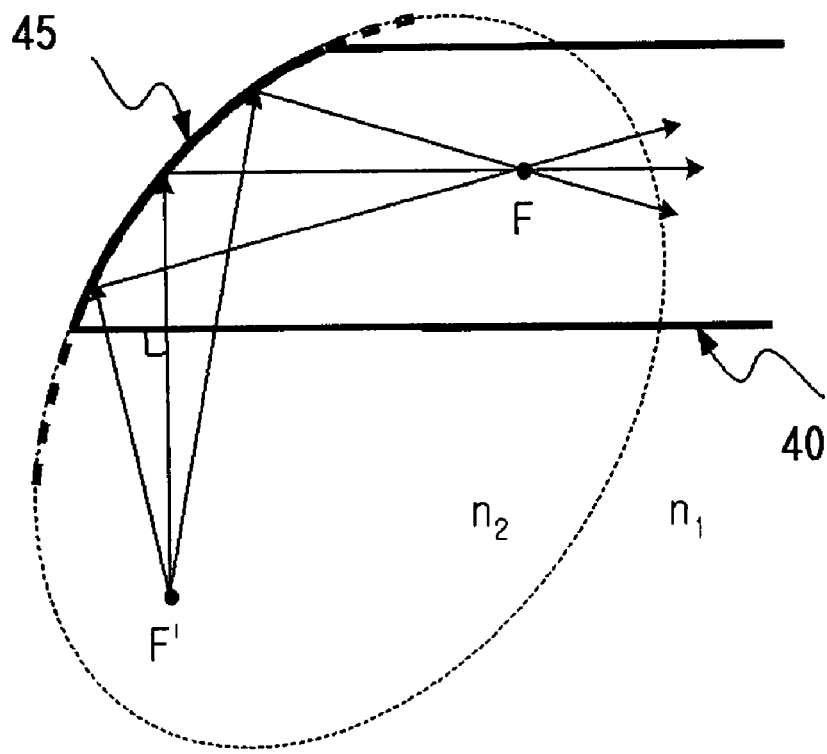
FIG. 6 is a schematic diagram illustrating light reflection that is generated in the optical waveguide having the elliptical reflecting mirror surface according to the present invention.

By selecting a portion, which is suitable for the width of the optical waveguide 40, from the total reflection region and rotating the optical waveguide 40 to become parallel to the x axis, the optical waveguide 40 having the elliptical mirror surface 45 can be implemented, as illustrated in FIG. 6.

The mirror surface 45 is defined as the intersection between two objects: one is the surface of revolution formed by rotating the ellipse in FIG. 5 about the x-axis; the other is a solid rectangular parallelepiped waveguide 40. In other words, the 3-dimensinally curved mirror surface 45 is formed by cutting the solid rectangular parallelepiped waveguide 45 by the surface of revolution formed by rotating the ellipse in FIG. 5.

The elliptical mirror surface 45 designed as described above reflects 100% of the rays of light emitted from the light source located at a focal point F', and causes the rays of light to gather at the focal point F inside the optical waveguide 40 and to move further along the optical waveguide 40.

Figure 7:
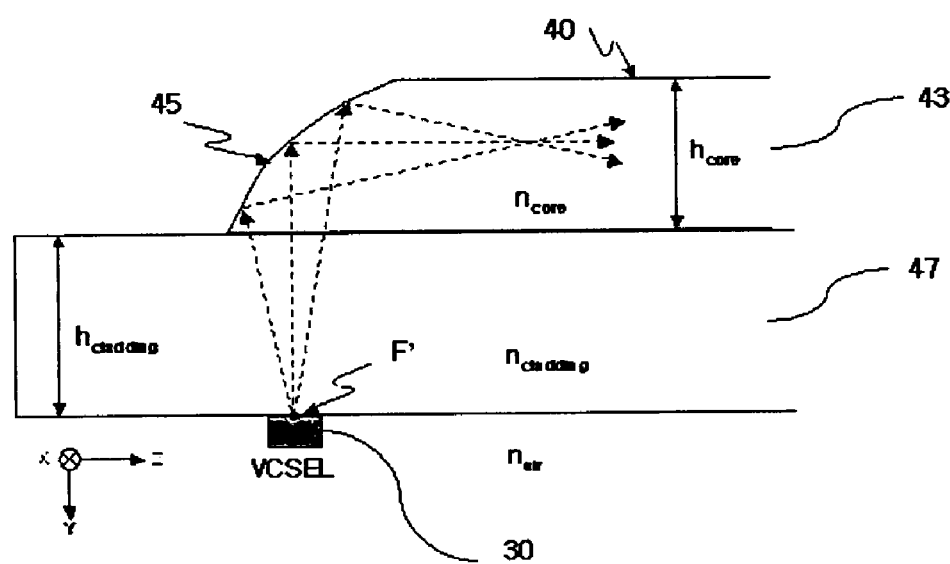
FIG. 7 is a schematic diagram illustrating the structure of the optical waveguide for vertically coupling light in the optical interconnection module according to the present invention.

FIG. 7 is a schematic diagram illustrating the structure of the optical waveguide for vertical optical coupling.

In FIG. 7, the optical waveguide 40 is formed by forming a core layer 43 on a cladding layer 47 that is formed on a substrate.

Light emitted from a VCSEL being used as a light source is reflected by an elliptical reflecting surface 45 formed at an end of the core layer 43 of the optical waveguide 40, and transmitted in the longitudinal direction of the optical waveguide 40.

Using the simple optical waveguide shown in FIG. 7, the coupling efficiency and allowable coupling error of the proposed elliptical mirror surface were calculated.

In FIG. 7, $h_{core}$, $h_{cladding}$, $n_{core}$, $n_{cladding}$ and $n_{air}$ designate the height of the core, the height of the cladding, the reflective index of the core, the reflective index of the cladding and the reflective index of air, respectively. Parameters used for the calculation of the coupling efficiency are $h_{core}$=50 μm, $h_{cladding}$=70 μm, $n_{core}$=1.51, $n_{cladding}$=1.49 and $n_{air}$=1. Furthermore, 15° was used as the emission angle of the VCSEL, and simulation was performed using a LightTools program, which is a commercial tool.

The allowable coupling error was obtained by calculating coupling efficiency based on the extent of deviation in the x-, y-, and z-axis directions based on the focal point F' of the ellipse.

In the simulation, as a result of the calculation of the coupling efficiency for the alignment error in the x-axis direction, it was ascertained that 100% coupling efficiency was obtained within an alignment error range of about ±18 μm. The 3 dB coupling efficiency had an allowable error of about more than ±25 μm.

As a result of the calculation of the coupling efficiency for the alignment error in the y-axis direction, 100% coupling efficiency was obtained within a range of about 45 μm and 3 dB coupling efficiency had an allowable error of more than 170 μm.

As a result of the calculation of the coupling efficiency for the alignment error in the z-axis direction, it could be ascertained that 100% coupling efficiency was obtained within a range of more than 10 μm in the −z-axis direction and 100% coupling efficiency was obtained only within a range of about 5 μm in the +z-axis direction. Accordingly, at the time of optical coupling between the VCSEL and the elliptical mirror surface, the alignment error in the +z-axis direction may affect the overall performance, so that attention must be paid particularly to the alignment in the +z-axis direction.

As described above, the optical interconnection module may be constructed based on the selection of the total reflection region from the elliptical surface.

Figure 8:
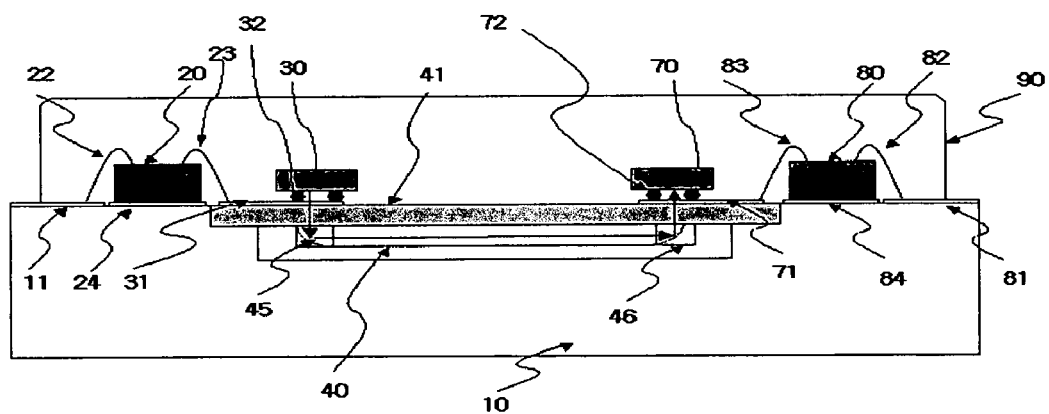
FIG. 8 is a schematic diagram of the optical interconnection module according to the present invention.

The optical interconnection module for the vertical coupling of light according to the present invention, as shown in FIG. 8, includes a printed circuit board 10 on which an electrode pad 11 and a predetermined circuit pattern are formed, a light source unit 30 that is placed on the printed circuit board 10, generates an optical signal, and radiates the optical signal toward an optical waveguide 40, an optical detection unit 70 that receives the optical signal from the light source unit 30 and converts the optical signal into an electric signal, drive units 20 and 80 that are placed on the printed circuit board 10 and drive the light source unit 30 and the optical detection unit 70 in response to electric signals supplied from the electrode pad 11, and an optical waveguide 40 that includes a cladding layer 42 and a core layer 43 layered on the cladding layer 42 and has an elliptically shaped reflecting mirror surface 45 at the end of the core layer 43 facing the light source unit 30.

The light source unit 30 includes a VCSEL that is used as a light source. Light is emitted from the light source unit 30 facing the optical waveguide 40, and carries an optical signal to the optical waveguide 40.

Furthermore, the light source unit 30 is located at one focal point of an ellipse constituting the reflecting mirror surface 45, and the optical waveguide 40 is arranged such that the direction of movement of totally reflected light is oriented to the other focal point of the ellipse.

A printed circuit board made of FR-4 or ceramic that is suitable for impedance matching and has low crosstalk or skew is used as the board, and the electrode pad 11 and the circuit pattern are formed on the board 10.

The drive unit 20 is bonded to a ground electrode 24 that is formed on the board 10.

Furthermore, the drive unit 20 is connected to the electrode pad 11 by a bonding wire 22, and is connected to an electrode pad 31, which is in contact with the light source unit 30, by another bonding wire 23.

The light source unit 30 is connected to the electrode pad 31, which is placed on an optical waveguide substrate 41, by solder bumps 32 formed by soldering, so that electric signals are transferred from the drive unit 20 to the light source unit 30.

A photodiode array, which is used as an optical detection unit 70, is placed on the other side of the optical waveguide 40.

The optical detection unit 70 is connected to the electrode pad 71, which is placed on the optical waveguide substrate 41, by solder bumps 72. The electric signal detected by the optical detection unit 70 is amplified by the drive unit 80 connected to the electrode pad 71 by a bonding wire 82, and is output to some other device through the electrode pad 81 connected to the drive unit 80 by a bonding wire 83.

The optical interconnection module further includes a housing 90 to protect the light source unit 30, the optical detection unit 70, the drive units 20 and 80 and the connection wiring thereof that are formed on the optical waveguide substrate 41.

Reference numeral 46 designates partition blocks that form a space beside the elliptical reflecting mirror surface 45.

Figure 9:
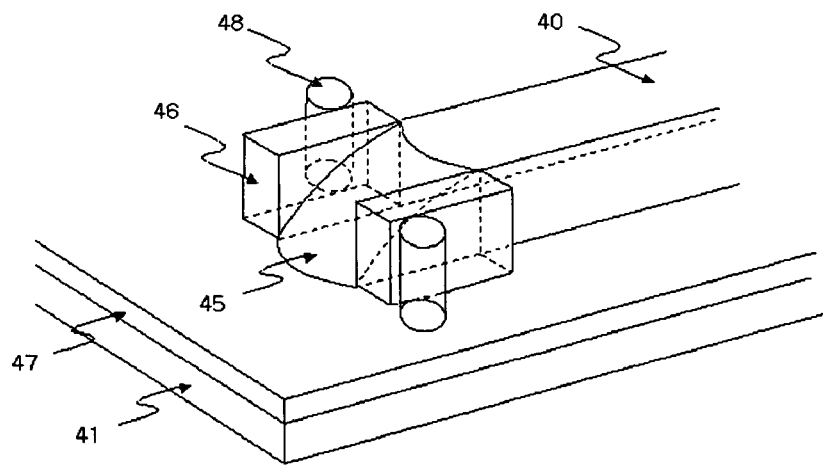
FIG. 9 is a detailed diagram illustrating the optical waveguide that is disposed in the optical interconnection module of FIG. 8.

FIG. 9 is a detailed diagram of the optical waveguide 40 disposed on the optical interconnection module of FIG. 8 according to the present invention.

Referring to FIG. 9, the elliptical reflecting mirror surface 45 is formed at one end of the optical waveguide 40 facing the light source unit 30, and further partition blocks 46 are placed beside both sides of the elliptical reflecting mirror surface 45 and the side ends of the optical waveguide 40.

The partition blocks 46 are used to form various curved surfaces and completely 3-D curved surfaces by limiting the flow of liquid material when the elliptical reflecting mirror surfaces 45 are formed by solidifying viscous liquid material at the ends of the optical waveguide 40.

In FIG. 9, a location F' is the location at which the center of the light source unit 30 is positioned, from which light is emitted, and which corresponds to one focal point of the ellipse of the elliptical reflecting mirror surface 45.

Meanwhile, as illustrated in FIG. 9, light emitted from location F' is totally reflected by the reflecting mirror surface 45, moves toward the other focal point F, which exists in the optical waveguide 40, in the longitudinal direction of the optical waveguide 40, is reflected by the inside wall of the optical waveguide 40 while passing through the focal point, and finally moves toward the other end of the optical waveguide 40.

Referring to FIG. 8 again, the elliptical reflecting mirror surfaces 45 are formed at both ends of the optical waveguide 40 to face the light source unit 30 and the optical detection unit 70.

In this case, a process in which light is transferred to the optical detection unit 70 is thought of as the optical signal, which passes through point F in FIG. 9, being reflected by the reflecting mirror surface 45 and entering the optical detection unit 70 located at point F'.

That is, the optical signal emitted from the light source unit 30 is first reflected by the reflecting mirror surface 45 placed at the end of the optical waveguide 40 facing the light source unit 30, is partially reflected by the internal surface of the optical waveguide 40, and reaches the optical detection unit 70 located at a focal point F shown in FIG. 9.

In that case, as illustrated in FIG. 9, the elliptical reflecting mirror surface 45 has a 3-dimensionally elliptical surface, so that the light reflected by the reflecting mirror surface 45 moves precisely to the focal point in the optical waveguide 40 while being totally reflected both in the lateral direction of the optical waveguide and in the vertical direction thereof.

FIG. 10A to FIG. 10G are plan views and sectional views illustrating the sequence of a process of manufacturing the optical interconnection module according to the present invention.

Referring to FIG. 10A to FIG. 10G, in the process of manufacturing the optical interconnection module according to the present invention, a cladding layer is layered on a glass substrate 41, that is, the optical waveguide substrate, and the optical waveguide functioning as a path through which optical signals are transferred is formed on the cladding layer.

Partition blocks 46 are placed beside both sides of the waveguide 40.

Elliptical reflecting mirror surfaces 45 are formed in the space, which is defined by the partition blocks 46 and the ends of the optical waveguide 40, using polymer.

Figure 10A:
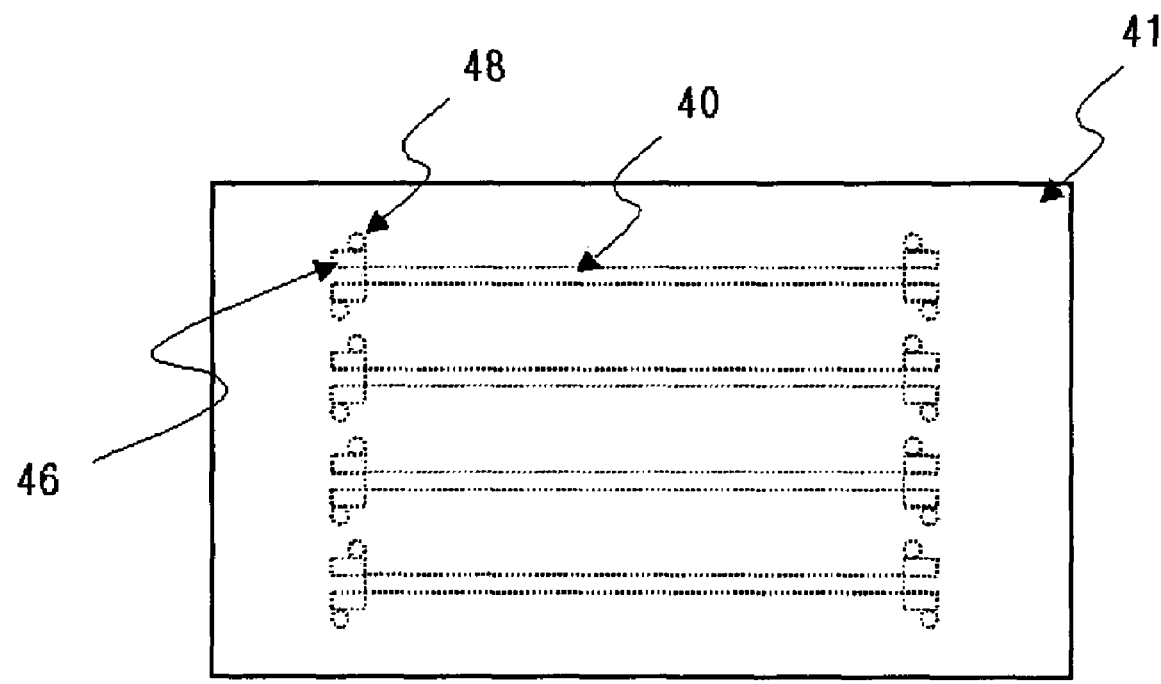
FIGS. 10A to 10G are plan views and sectional views illustrating the sequence of a process of manufacturing the optical interconnection module according to the present invention.
Figure 10A:
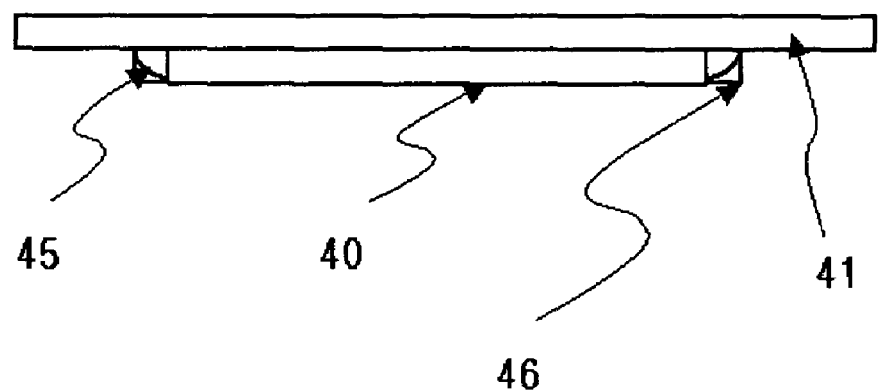

The plan view of FIG. 10A illustrates the bottom surface of the optical waveguide 40.

When the optical waveguide 40 having the elliptical reflecting mirror surfaces 45 between the partition blocks 46 is formed, keys or marks for aligning a VCSEL array and a photodiode array, that is, the light source unit and the optical detection unit, which are mounted on the glass substrate 41 of the optical waveguide 40, may be formed at the same time.

Reference numeral 48 illustrated in the plan view of FIG. 10A designates the alignment keys that are formed on the back surface of the glass substrate 40.

Figure 10B:
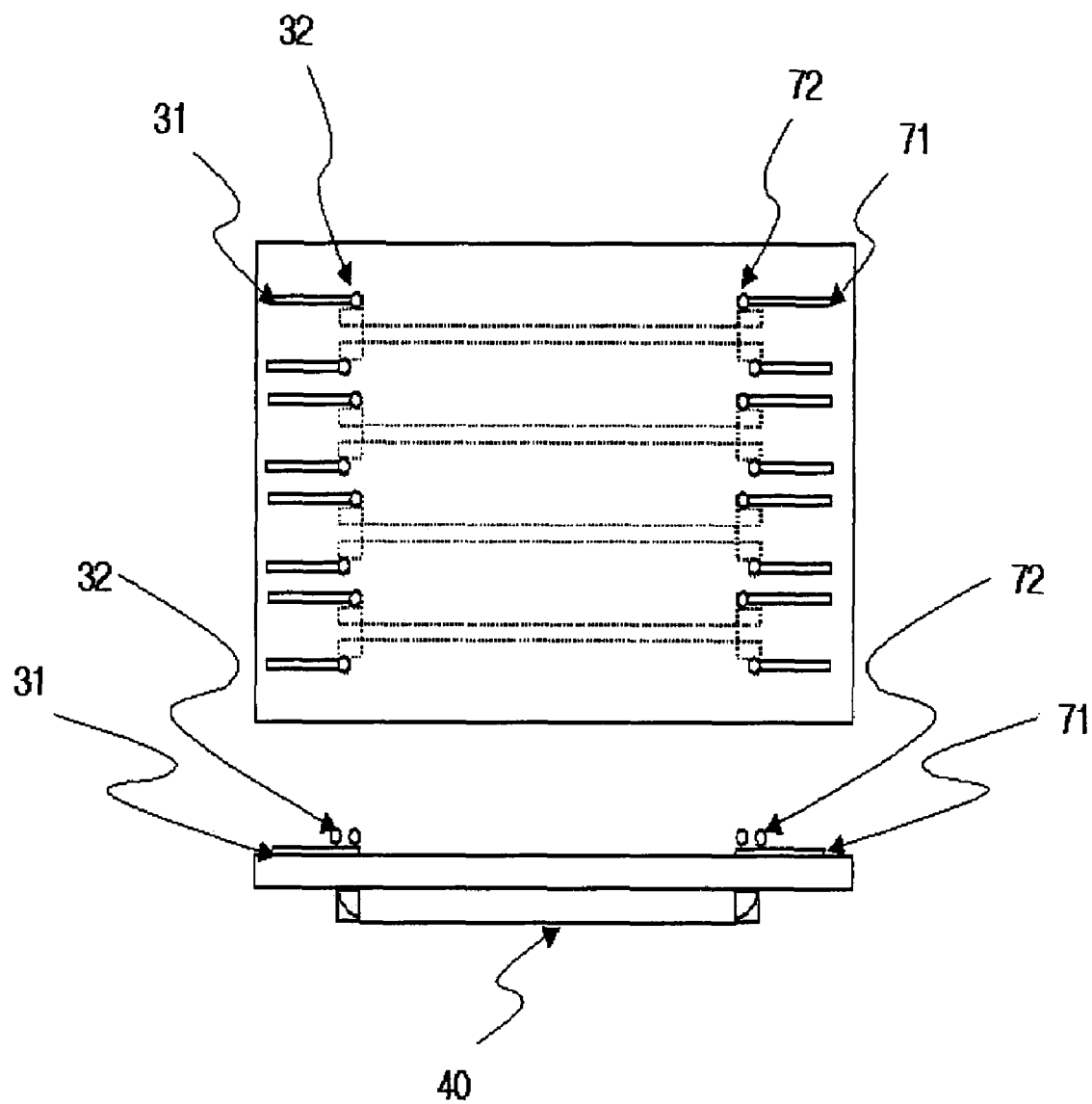

Thereafter, as illustrated in FIG. 10B, the electrode pads 31 and 71 for achieving electrical connections to a VCSEL array and a photodiode array, that is, the light source unit and the optical detection unit 70, and solder bumps 32 and 72 for connecting the VCSEL array and the photodiode array to he electrode pads 31 and 71 and disposing them on the glass substrate 41 are provided on the glass substrate 41 of the optical waveguide 40.

Figure 10C:
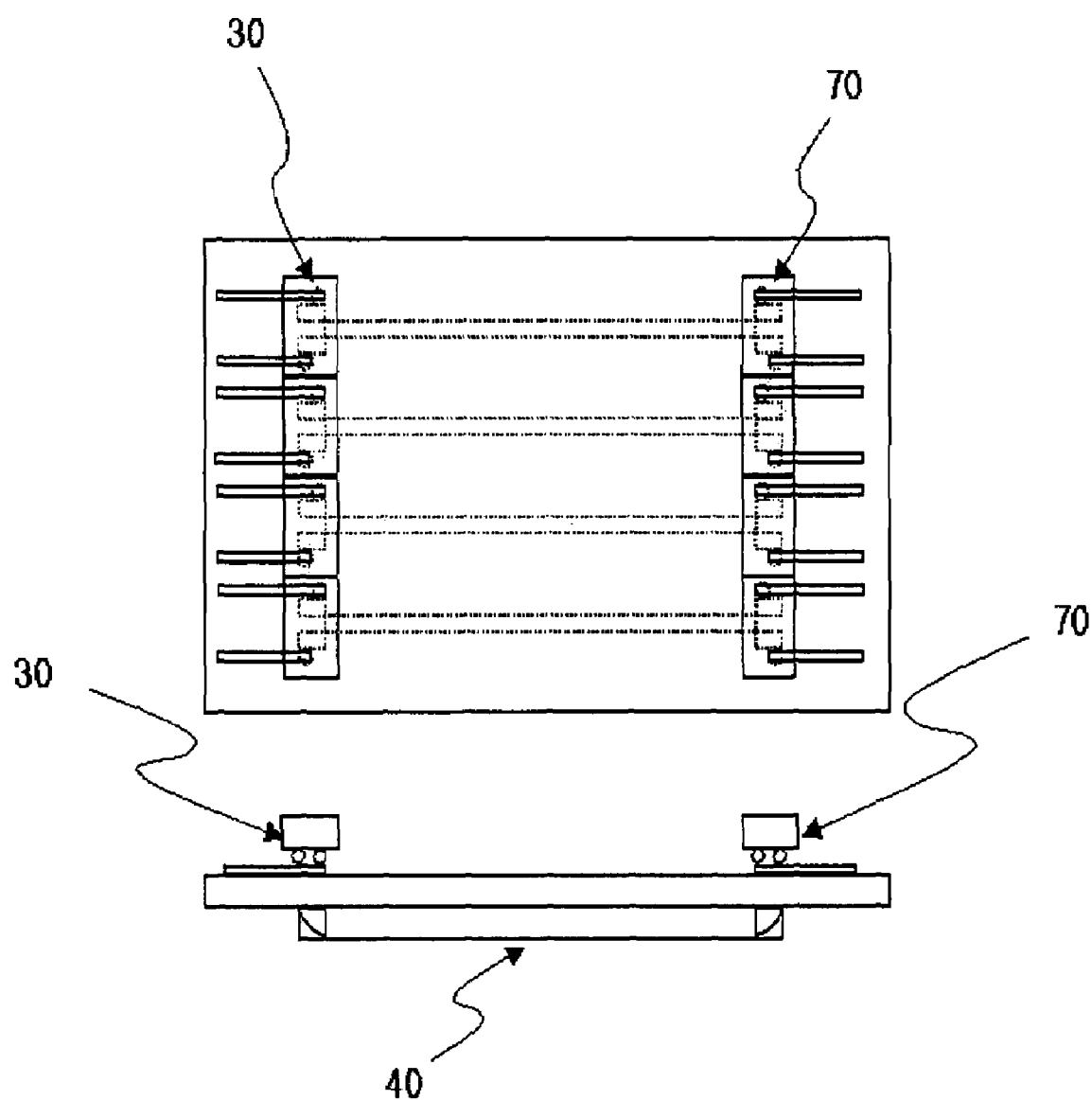

Thereafter, as shown in FIG. 10C, the VCSEL arrays and the photodiode arrays, that is, the light source units 30 and the optical detection units 70, are connected to and mounted on the solder bumps 32 and 72.

Figure 10D:
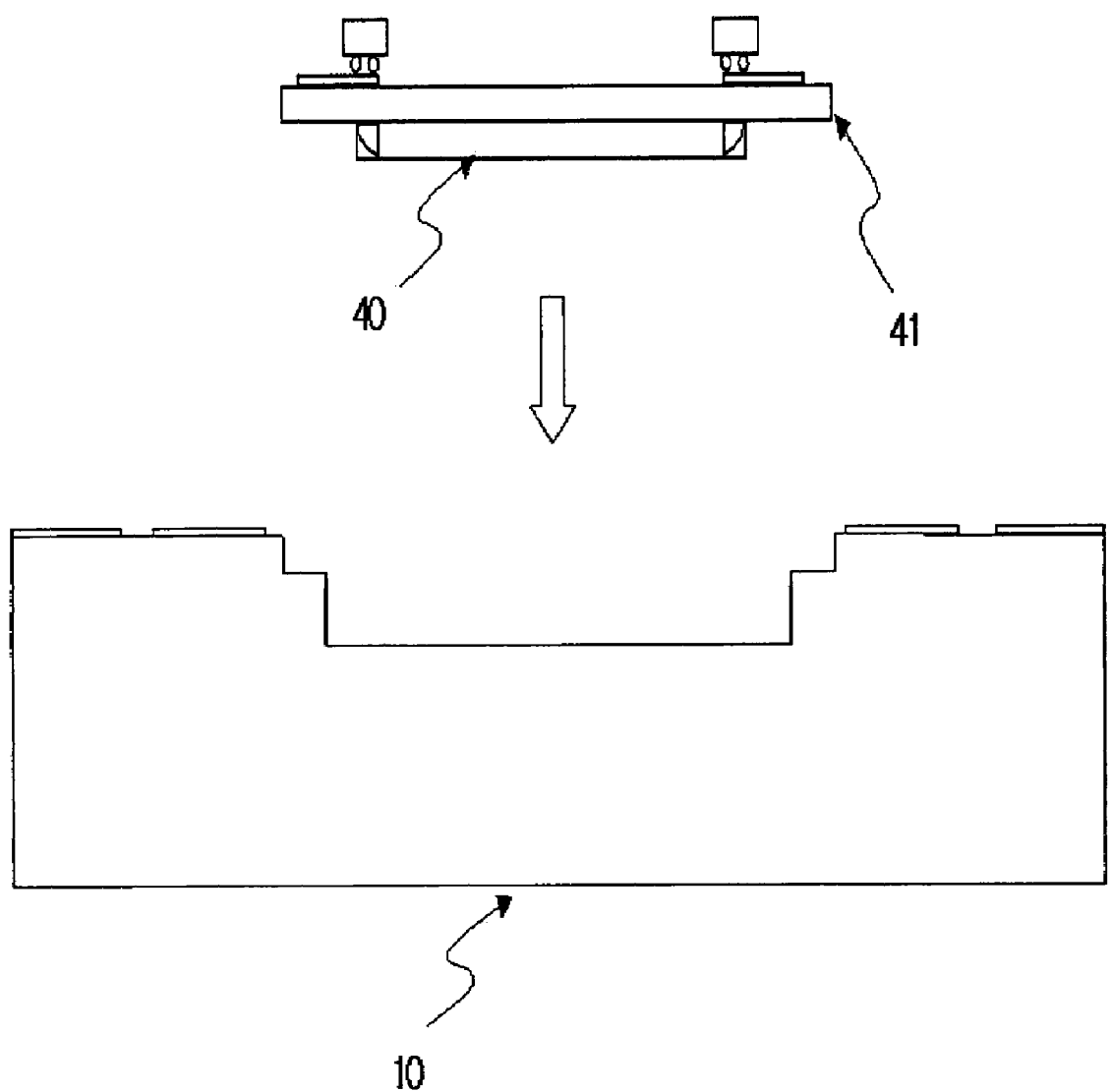

Subsequently, as shown in FIG. 10D, the optical waveguides 40 on which the VCSEL arrays and the photodiodes manufactured as shown in FIG. 10C are mounted are attached at the predetermined locations of the previously manufactured printed circuit board 10.

Figure 10E:
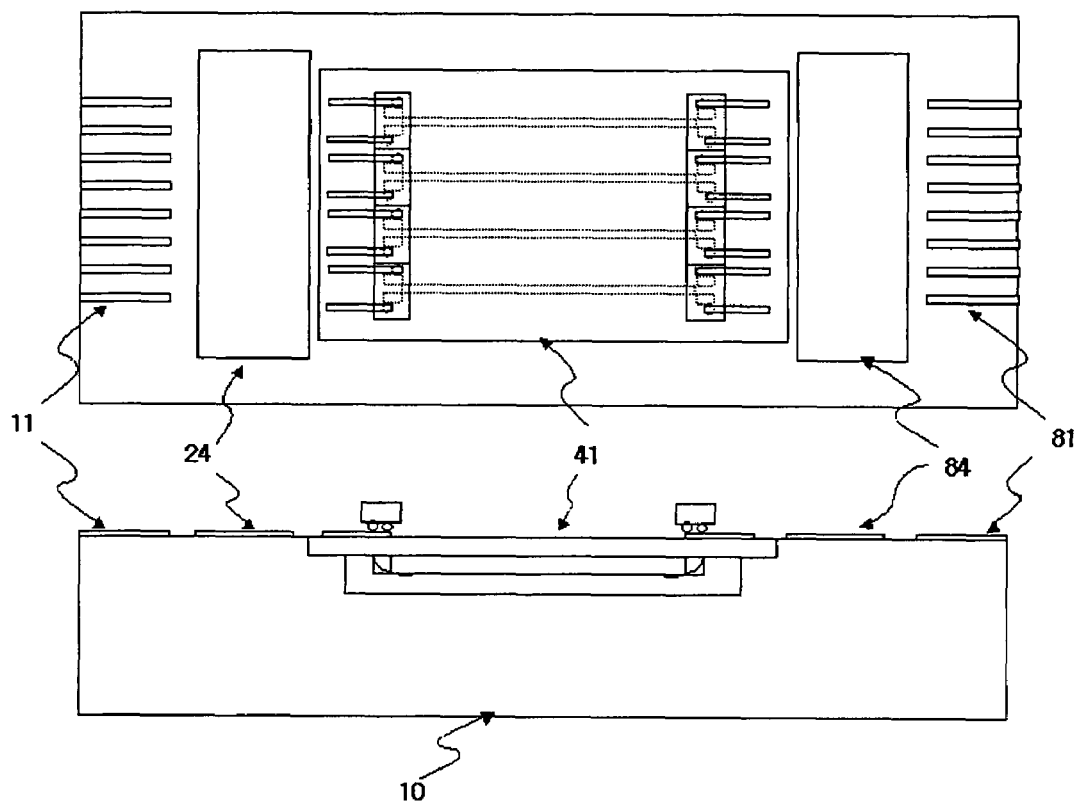

FIG. 10E illustrates the state in which the optical waveguides 40, on which the VCSEL arrays and the photodiodes are mounted, are combined with the printed circuit board 10 on which the electrode pads 11 and 81 and the ground electrodes 24 and 84 are formed.

Figure 10F:
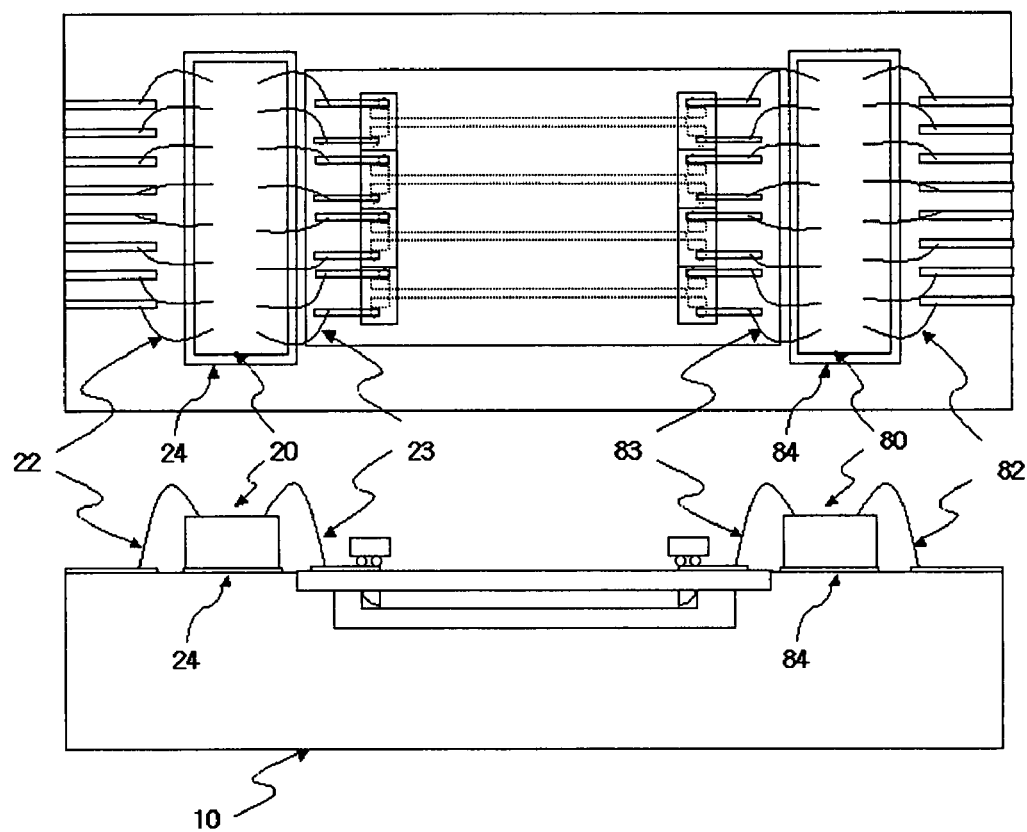

Next, as shown in FIG. 10F, the drive units 20 and 80 are connected to the ground electrodes 24 and 84, and the drive units 20 and 80 are connected to the electrode pads 11 and 81 through the bonding wires 22 and 83 and to the VCSEL array, that is, the light source unit 30, and the photodiode, that is, the optical detection unit 70, through other bonding wires 23 and 82.

Figure 10G:
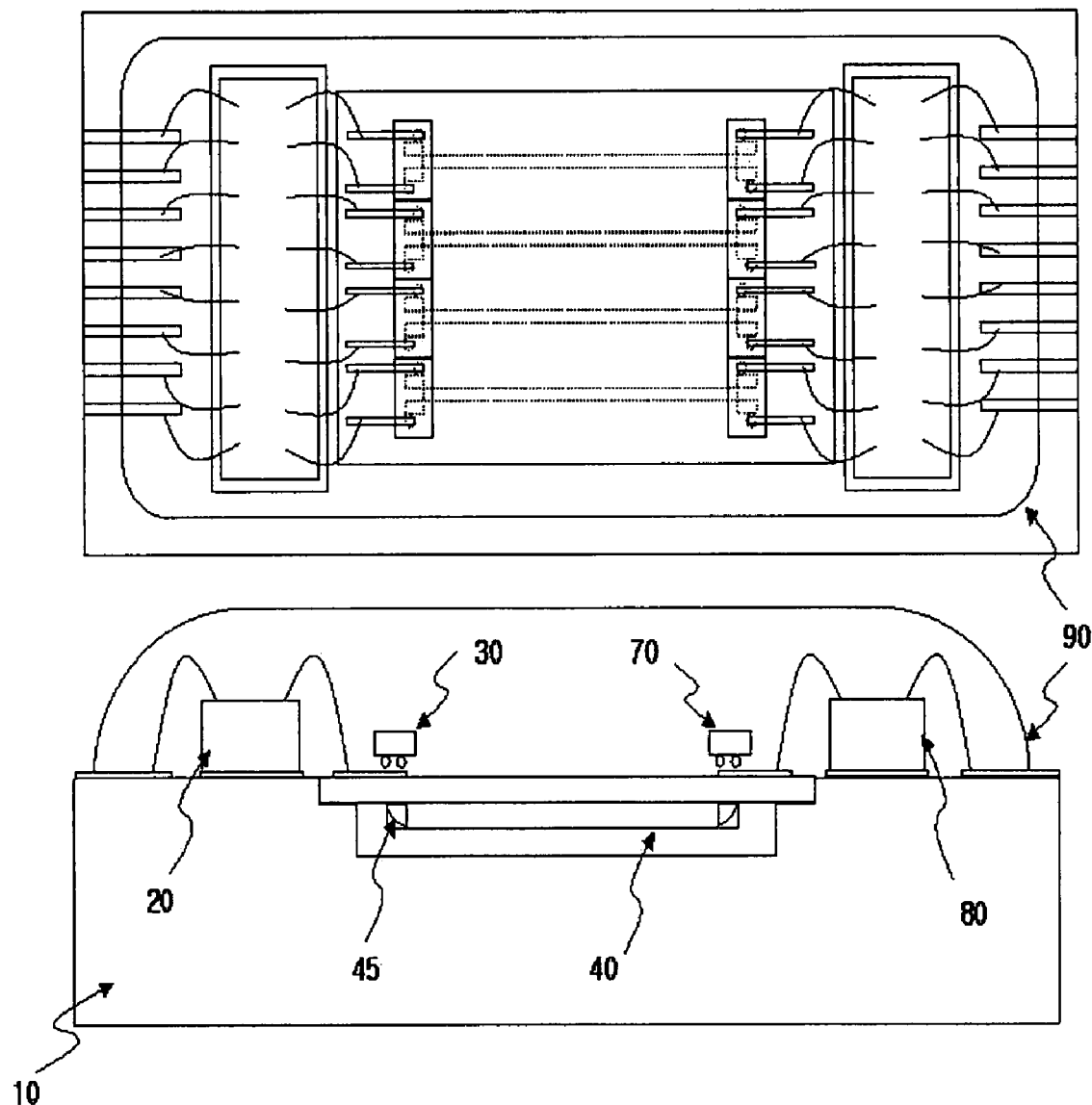

Finally, as shown in FIG. 10G, a process of mounting the housing 90 to protect the optical waveguides 40, the light source units 30 and the optical detection units 70 connected to the optical waveguides 40, and the connection wiring thereof is performed.

Meanwhile, the protective housing 90 may not be mounted depending on a circuit device, and can be replaced by some other capsule for protecting the entire printed circuit board 10.

As described above, the optical interconnection module and the method of manufacturing the optical interconnection module according to the present invention are advantageous in that the total reflection of light signals can be achieved and the coupling loss of rays of light that are vertically coupled from the light source unit to the optical waveguide can be completely prevented.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An optical interconnection module comprising:
   a substrate on which electrode pads and a predetermined circuit pattern are formed;
   a light source unit provided on the substrate and configured to generate an optical signal and emit the signal to an optical waveguide;
   an optical detection unit for receiving the optical signal from the light source unit and converting the optical signal into an electric signal;
   drive units provided on the substrate and configured to drive the light source unit and the light detection unit in response to electric signals supplied through the electrode pads; and
   the optical waveguide including a cladding layer, a core layer covered with the cladding layer, and an elliptical reflecting mirror surface formed at an end of the core layer, which reflects and focuses light incident from the light source unit wherein an incident angle θ of the light incident from a light source of the light source unit, that is, a light transmission device, is determined by the following Equation:

$$\theta = \frac{1}{2}\sin^{-1}\left(\frac{2}{PF \cdot PF'}\sqrt{S(S-PF)(S-PF')(S-FF')}\right)$$

where $$S = \frac{1}{2}(PF + PF' + FF'),$$

PF is a distance from a point of an ellipse to a focal point F,
PF' is a distance from the point of the ellipse to a focal point F', and
FF' is a distance between the focal points.

2. The optical interconnection module as set forth in claim 1, wherein the light source unit comprises a Vertical Cavity Surface Emitting Laser (VCSEL) array.

3. The optical interconnection module as set forth in claim 1, wherein the light source is located at one focal point of an ellipse forming the reflecting mirror surface, and the core of optical waveguide is centered at another focal point in such a manner that the body of waveguide is oriented to the direction of light reflected through 90 degrees from the mirror surface.

4. The optical interconnection module as set forth in claim 1, wherein the elliptical reflecting mirror surface is a 3-dimenstional curved surface.

5. The optical interconnection module as set forth in claim 1, further comprising an elliptically curved reflecting mirror surface that is formed at an end of the core layer of the optical waveguide facing the optical detection unit.

6. The optical interconnection module as set forth in claim 1, further comprising a housing for protecting the light source unit, the optical detection unit, the drive units and connection wiring thereof.

7. The optical interconnection module as set forth in claim 1, wherein the optical detection unit comprises a photodiode array.

8. An optical interconnection module comprising:
   a substrate on which electrode pads and a predetermined circuit pattern are formed;
   a light source unit provided on the substrate and configured to generate an optical signal and emit the signal to an optical waveguide;
   an optical detection unit for receiving the optical signal from the light source unit and converting the optical signal into an electric signal;

drive units provided on the substrate and configured to drive the light source unit and the light detection unit in response to electric signals supplied through the electrode pads; and the optical waveguide including a cladding layer, a core layer covered with the cladding layer, and an elliptical reflecting mirror surface formed at an end of the core layer, which reflects and focuses light incident from the light source unit wherein a length l of a total reflection region of an ellipse applied to the elliptical reflecting mirror surface is determined by the following Equation:

$$l = 2ab \int_{\phi_c}^{\frac{\pi}{2}} \frac{1}{\sqrt{a^2\sin^2\phi + b^2\cos^2\phi}} d\phi$$

where $\emptyset_c$ is an angle between line $\overline{OP_c}$, which extends from an origin O of the ellipse to point $P_c(X_c, Y_c)$ from which an critical angle starts, and an x axis, a is a length of a major axis of the ellipse, and
b is a length of a minor axis of the ellipse,
wherein $\emptyset_c$ is determined by the following Equation:

$$\phi_c = \sin^{-1}\left(\frac{2}{OF \cdot r_c}\sqrt{T(T-OF)(T-r)(T-P_c)}\right)$$

where $T = \frac{1}{2}(OF + r_c + P_cF)$, $OF = \sqrt{a^2 - b^2}$, a distance between the origin and the focal point, $r_c = \sqrt{x_c^2 + y_c^2}$, a distance between the origin and point $P_c(x_c, y_c)$, $$P_cF = \sqrt{\left(x_c - \sqrt{a^2 - b^2}\right)^2 + y_c^2},$$

a distance between the focal point and point $P_c(x_c, y_c)$.

9. The optical interconnection module as set forth in claim 8, wherein a ratio of the major axis to the minor axis a/b is approximately 2.

10. An optical interconnection module comprising:
a substrate on which electrode pads and a predetermined circuit pattern are formed;
a light source unit provided on the substrate and configured to generate an optical signal and emit the signal to an optical waveguide;
an optical detection unit for receiving the optical signal from the light source unit and converting the optical signal into an electric signal;
drive units provided on the substrate and configured to drive the light source unit and the light detection unit in response to electric signals supplied through the electrode pads;
the optical waveguide including a cladding layer, a core layer covered with the cladding layer, and an elliptical reflecting mirror surface formed at an end of the core layer, which reflects and focuses light incident from the light source unit; and
partition blocks that support shaping the elliptical reflecting mirror surface at the end of the optical waveguide.

11. A method of manufacturing an optical interconnection module, comprising the steps of:
fabricating an optical waveguide in such a manner that a cladding layer is deposited on a substrate of the optical waveguide, a core layer is then deposited on the cladding layer, partition blocks are formed at the end of the two sides of the core layer, and an elliptical reflecting mirror surface is shaped in a space between the partition blocks;
forming electrode pads on the substrate of the optical waveguide to connect a light source unit and an optical detection unit to the optical waveguide, and providing solder bumps beside first ends of the electrode pads;
mounting the light source unit and the optical detection unit on the substrate of the optical waveguide, with the light source unit and the optical detection unit connected to the solder bumps;
attaching the substrate of the optical waveguide, on which the light source unit and the optical detection unit are mounted, to a previously manufactured printed circuit board at a predetermined location; and
mounting drive units on ground electrodes formed on the printed circuit board, connecting the drive units to the light source unit and the optical detection unit, and connecting the drive units to electric pads formed on the printed circuit board to achieve external electrical connections.

12. The method as set forth in claim 11, further comprising the step of mounting a housing to protect the optical waveguide, the light source unit and the optical detection unit connected to the optical waveguide, and connection wiring thereof.

13. The method as set forth in claim 11, wherein keys or marks for aligning the light source unit and the optical detection unit are formed on the substrate of the optical waveguide in which the elliptical reflecting mirror surface is formed between the partition blocks.

* * * * *